United States Patent [19]

Ouchi et al.

[11] Patent Number: 5,768,107
[45] Date of Patent: Jun. 16, 1998

[54] ELECTRIC CIRCUIT SUBSTRATE HAVING A MULTILAYER ALIGNMENT MARK STRUCTURE

[75] Inventors: Toshimichi Ouchi, Yokohama; Masanori Takahashi, Chigasaki, both of Japan

[73] Assignee: Canon Kabushiki Kaisha, Tokyo, Japan

[21] Appl. No.: 666,811

[22] Filed: Jun. 19, 1996

[30] Foreign Application Priority Data

Jun. 20, 1995 [JP] Japan .................... 7-153696

[51] Int. Cl.$^6$ .................... H05K 1/14
[52] U.S. Cl. .................... 361/792; 361/748; 174/255; 349/152
[58] Field of Search .................... 361/748, 789, 361/792, 793, 795, 802; 349/84, 139, 150, 152; 174/255, 268

[56] References Cited

U.S. PATENT DOCUMENTS

| | | | |
|---|---|---|---|
| 4,423,127 | 12/1983 | Fujimura | 430/22 |
| 4,634,227 | 1/1987 | Nishimura et al. | 349/84 |
| 4,710,250 | 12/1987 | Kojima | 156/250 |
| 5,418,691 | 5/1995 | Tokura | 361/792 |
| 5,468,917 | 11/1995 | Brodsky et al. | 174/255 |

*Primary Examiner*—Leo P. Picard
*Assistant Examiner*—John B. Vigushin
*Attorney, Agent, or Firm*—Fitzpatrick, Cella, Harper & Scinto

[57] ABSTRACT

An electric circuit substrate having a multilayer structure is constituted from at least three wiring layers including an outermost wiring layer, at least one first inner wiring layer disposed under the outermost wiring layer, and a second inner wiring layer disposed under the at least one first inner wiring layer, each provided with a prescribed conductor pattern, respectively. In the multilayer structure, the outermost wiring layer has an alignment mark, the above-mentioned at least one first inner wiring layer has a blank portion free from its conductor pattern in a position immediately under the alignment mark, and the second inner wiring layer has an entire solid portion of its conductor pattern in a position immediately under the blank portion. The above multilayer structure including the alignment mark is effective in preventing recognition error or recognition failure of the alignment mark, thus allowing accurate positioning of the electric circuit substrate.

13 Claims, 3 Drawing Sheets

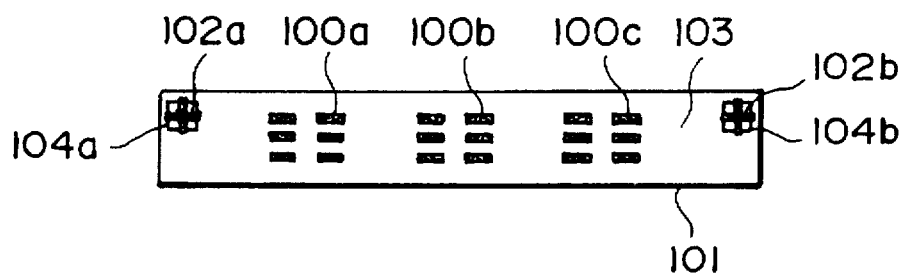
F I G. 1
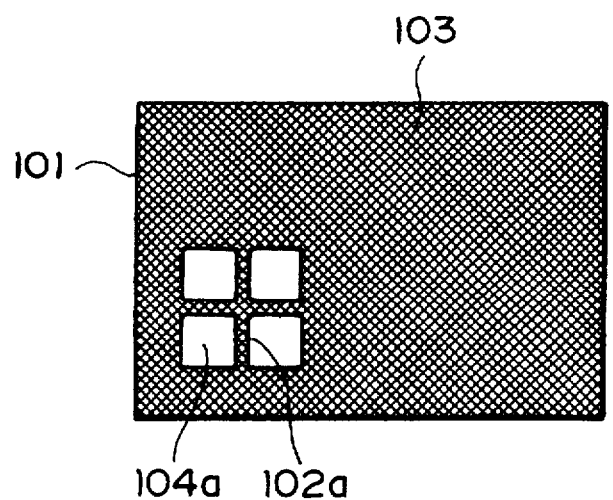
F I G. 2

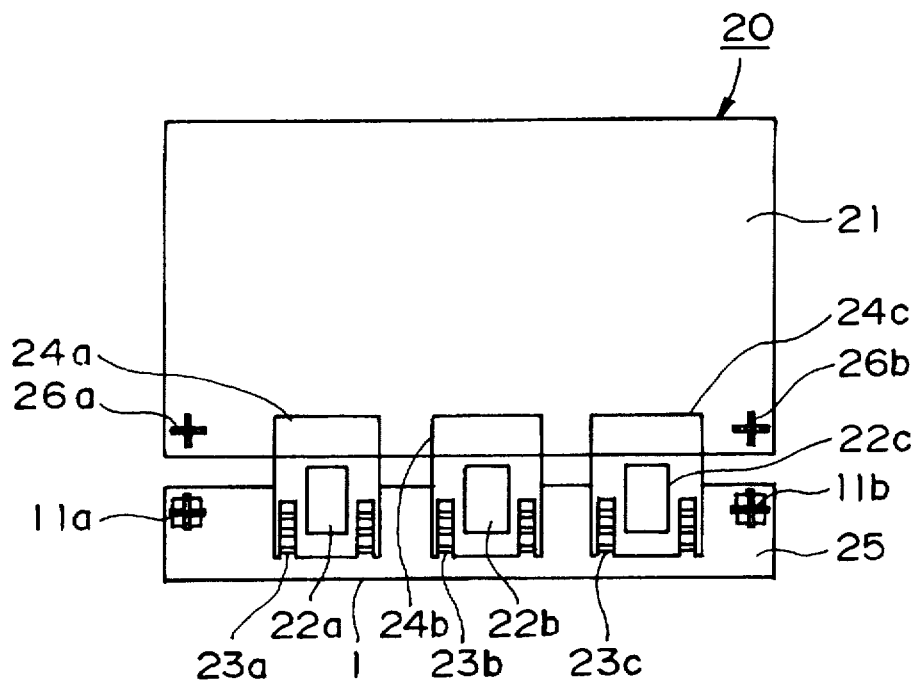
F I G. 5

1

ELECTRIC CIRCUIT SUBSTRATE HAVING A MULTILAYER ALIGNMENT MARK STRUCTURE

BACKGROUND OF THE INVENTION AND RELATED ART

The present invention relates to an electric circuit substrate (board) having a specific alignment mark structure for recognizing a position of thereof and a liquid crystal panel unit equipped with the electric circuit substrate.

In recent years, IC (integrated circuit) chips have been mounted on an electric circuit substrate at a small pitch (e.g., at most 0.5 mm).

Accordingly, it is important that a position of the electric circuit substrate is precisely recognized by an automatic machine or apparatus for positional recognition when the IC chips are mounted on the electric circuit substrate by using the automatic machine. For this reason, in order to allow the automatic machine to accurately locate (recognize the position of) the electric circuit substrate, an alignment mark for that purpose is provided onto the electrode circuit substrate.

FIG. 1 is a plan view showing an ordinary electric circuit substrate (or printed circuit board) provided with an alignment mark (structure) (hereinafter, referred to as "PCB substrate") and FIG. 2 is a partially enlarged view of an alignment mark portion shown in FIG. 1.

Referring to FIGS. 1 and 2, a PCB substrate 101 having a multi-layer structure including a plurality of wiring layers includes lands 100a, 100b and 100c formed at a prescribed pitch (spacing) for mounting thereon plural IC chips and alignment marks 102a and 102b in the form of a cross for positional recognition of the PCB substrate 101 at two corners (upper left and upper right corners), respectively. The alignment marks 102a and 102b are consisting of a copper foil-conductor pattern (not shown) of an outermost (wiring) layer and enclosed (surrounded) by openings 104a and 104b at which a layer of a solder resist 103 is not formed.

The surface of the alignment mark (102a, 102b) is exposed to ambient air as described above and accordingly is liable to cause corrosion due to oxidation etc.

In case where the alignment marks 102a and 102b are corroded, the alignment marks 102a and 102b change in shape, thus being liable to cause a recognition error by the automatic machine.

The recognition error is also found in the case of locating a wiring pattern of a lower copper foil layer immediately under the alignment marks (102a, 102b). In this case, the automatic machine is liable to erroneously recognize the wiring pattern as the alignment marks.

SUMMARY OF THE INVENTION

An object of the present invention is to provide an electric circuit substrate having an alignment mark capable of preventing recognition error of the alignment mark.

Another object of the present invention is to provide a liquid crystal panel unit including the electric circuit substrate.

According to the present invention, there is provided an electric circuit substrate having a multilayer structure, comprising: at least three wiring layers including an outermost wiring layer, at least one first inner wiring layer disposed under the outermost wiring layer, and a second inner wiring layer disposed under the at least one first inner wiring layer, each provided with a prescribed conductor pattern, respectively, wherein

2 the outermost wiring layer has an alignment mark, the above at least one first inner wiring layer has a blank portion free from its conductor pattern in a position immediately under the alignment mark, and the second inner wiring layer has an entire solid portion of its conductor pattern in a position immediately under the blank portion.

According to the present invention, there is also provided a liquid crystal panel unit, comprising:

a liquid crystal device including a pair of substrates and a liquid crystal disposed between the substrates, and having an alignment mark, a tape carrier package having thereon a semiconductor element for driving the liquid crystal device and mounted on the liquid crystal device, and an electric circuit substrate connected with the tape carrier package and having a multilayer structure, comprising: at least three wiring layers including an outermost wiring layer, at least one first inner wiring layer disposed under the outermost wiring layer, and a second inner wiring layer disposed under the at least one first inner wiring layer, each provided with a prescribed conductor pattern, respectively, wherein the outermost wiring layer has an alignment mark, the above at least one first inner wiring layer has a blank portion free from its conductor pattern in a position immediately under the alignment mark of the outermost wiring layer, and the second inner wiring layer has an entire solid portion of its conductor pattern in a position immediately under the blank portion.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5 is a plan view of an embodiment of the liquid crystal panel unit including the electric circuit substrate having an alignment mark structure according to the present invention.

DETAILED DESCRIPTION OF THE PREFERRED EMBODIMENTS

Hereinbelow, the present invention will be described with reference to FIGS. 3–5.

Figure 3:
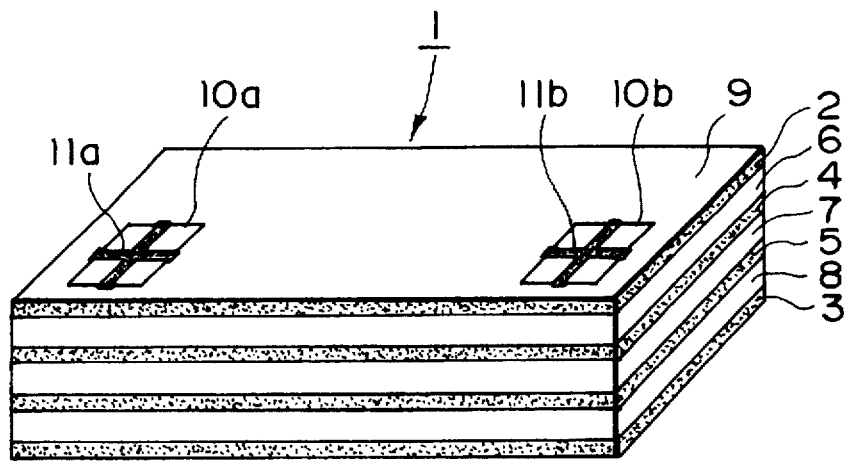
FIG. 3 is a perspective view of an embodiment of the electric circuit substrate having an alignment mark structure according to the present invention.

FIG. 3 is a perspective view of an embodiment of an electric circuit substrate having an alignment mark structure (PCB substrate) according to the present invention.

The PCB substrate may preferably have a multi-layer structure comprising plural wiring layers including: an outermost wiring layer provided with an alignment mark, at least one first inner wiring layer having a blank (or opening)

portion with no conductor (wiring) pattern (immediately) under the alignment mark, and a second inner wiring layer having an entire solid portion constituted by a conductor pattern (immediately) under the blank portion.

Referring to FIG. 3, a PCB substrate 1 include four wiring layers consisting of a first outer wiring layer (outermost (upper outer) wiring layer) 2 having openings 10a and 10b and alignment marks 11a and 11b (hereinafter, inclusively referred to as "alignment mark portion(s)"), a second (lower) outer wiring layer 3, and a first inner wiring layer 4 having a blank portion and a second inner wiring layer 5 having an entire solid portion disposed between the first and second outer wiring layers 2 and 3.

Each of the wiring layers 2, 3, 4 and 5 is provided with a prescribed conductor pattern. Materials for the conductor may preferably include copper foil.

Between the consecutive two wiring layers (2 and 4, 4 and 5, 5 and 3), insulating layers 6, 7 and 8 are disposed, respectively. Each of the insulating layer may preferably comprise transparent or semitransparent (translucent) material, such as glass fiber-containing epoxy resin.

In this embodiment, each of the wiring layers 2, 3, 4 and 5 comprises copper foil formed in a prescribed pattern.

The entire surface of the first outer wiring layer 2 (as a conductor pattern) except for a region including the alignment marks 11a and 11b (and the openings 10a and 10b) is coated with a coating layer 9 comprising, e.g., a solder resist. The alignment mark 11a and 11b may preferably comprise copper foil identical to that of the fist outer wiring layer 2 and may preferably be in the form of a cross. The surface of the alignment mark (11a, 11b) may preferably be coated with a coating layer of plated solder (not shown) according to a prescribed method (e.g., electroplating).

Figure 4:
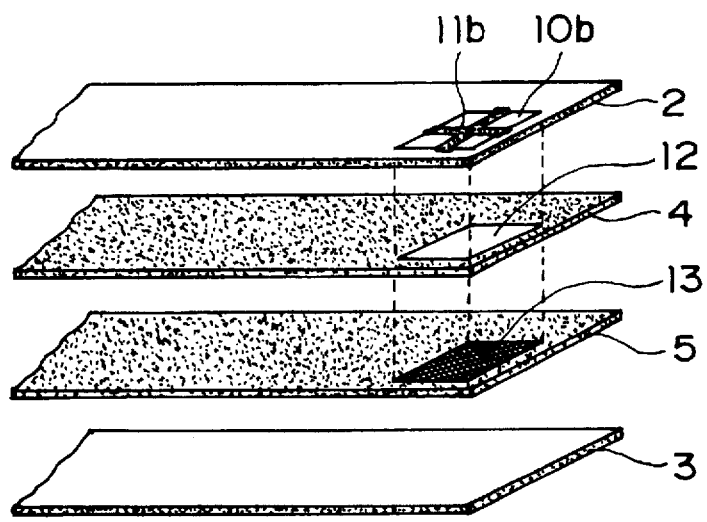
FIG. 4 is an explanatory view of the alignment mark structure shown in FIG. 3.

FIG. 4 is a view for illustrating the alignment mark structure shown in FIG. 3 wherein the insulating layers 6, 7 and 8 are omitted for convenience of explanation.

Referring to FIG. 4, immediately under the alignment mark portion (consisting of the alignment mark 11b and the opening 10b) of the first outer wiring layer 2, a blank portion (opening portion) 12 free from the conductor (copper foil) pattern (not shown) is provided to the first inner wiring layer 4. The second inner wiring layer 5 is provided with an entire solid pattern (entire solid black portion) 13, preferably a copper foil portion treated so as to have a black surface, immediately under the blank portion 12, e.g., by roughening the entire surface of the wiring layer 5. The above-mentioned three portions (the alignment mark portion (10b, 11b), the blank portion 12 and the entire solid portion 13) may preferably have an identical area and may preferably correspond to each other when viewed in a vertical direction (from the alignment mark portion side).

As described above, according to this embodiment shown in FIGS. 3 and 4, the PCB substrate have a such an alignment mark structure that each of the alignment mark portions (e.g., 10b and 11b) of the first outer wiring layer 2, each of the blank portions 12 of the first inner wiring layer 4 disposed under the corresponding alignment mark portion, and each of the entire solid portions 13 of the second inner wiring layer 5 disposed under the corresponding blank portion are orderly arranged in a vertical direction, thus avoiding a superposition of the alignment mark (11a, 11b) of the wiring layer 2 on lower (wiring) conductor patterns formed on the lower wiring layers 4 and 5 to prevent a recognition error or recognition failure of the alignment mark (11a, 11b) by an automatic machine. Further, the alignment mark (11a, 11b) can be clearly observed from over the alignment mark because the entire solid portion 13 as a background of the alignment mark may effectively be treated to have a black surface, thus attaining a good contrast (optical contrast) between the (plated solder-coated) alignment mark and the entire solid portion to improve a degree of optical recognition. In addition, the surface of the alignment mark (11a, 11b) is coated with the coating layer comprising plated solder as described above, whereby corrosion of the alignment mark can effectively be prevented.

Incidentally, in the above-described embodiment, the PCB substrate 1 (as shown in FIG. 3) may, e.g., be prepared as follows.

The first outer wiring layer 2 (conductor pattern) and the first inner wiring layer 4 (conductor pattern) are formed on the upper and lower surfaces of the insulating layer 6, respectively. Separately, the second outer wiring layer 3 (conductor pattern) and the second inner wiring layer 5 are formed on the lower and upper surface of the insulating layer 8, respectively. Thereafter, these insulating layers 6 and 8 each provided with both-sided conductor patterns are applied to each other via the insulating layer 7, thus preparing the PCB substrate (electric circuit substrate) 1.

In this case, entire opposite surfaces of the first and second inner wiring layers 4 and 5 may preferably be roughened to provide a black surface, respectively, in order to improve adhesiveness between the wiring layers 4 and 5. As a result, the entire solid portion 13 corresponding to the alignment mark portion (10b and 10b) and the blank portion 12 can be uniformly provided with an entire black surface.

FIG. 5 is a plan view of an embodiment of the liquid crystal panel unit including an electric circuit substrate having an alignment mark structure (PCB substrate) according to the present invention.

Referring to FIG. 5, a liquid crystal panel unit 20 includes a liquid crystal display panel (liquid crystal device) 21 including a pair of substrates and a liquid crystal disposed between the substrates, tape carrier packages (TCPs) 24a, 24b and 24c mounted on the liquid crystal display panel 21, and a PCB substrate (electric circuit substrate) 1 connected with the tape carrier packages 24a, 24b and 24c. On the tape carrier packages 24a, 24b and 24c, semiconductor elements (ICs) 22a, 22b and 22c for driving the liquid crystal display panel 21 and input terminals 23a, 23b and 23c are mounted according to tape automated bonding (TAB) system. These tape carrier packages 24a, 24b and 24c are preliminarily coated with solder and mounted on one end portion of the liquid crystal display panel 21 in advance.

On the surface of the PCB substrate 1, a land portion 25 for mounting thereon the tape carrier package (TCPs) 24a, 24b and 24c is provided.

In the vicinity of upper left and right corners (on the drawing) of the surface of the PCB substrate 1, crossed alignment marks 11a and 11b having a structure as specifically shown in FIGS. 3 and 4 are formed, respectively.

Further, in the vicinity of lower left and right corners of the liquid crystal display panel 21 surface, crossed alignment marks 26a and 26b each corresponding to the alignment marks 11a and 11b of the PCB substrate 1, respectively, are formed.

Hereinbelow, a positional alignment operation by using an automatic machine wherein, on the PCB substrate 1, the respective input terminals 23a, 23b and 23c of the TCPs 24a, 24b and 24c mounted on the liquid crystal display panel 21 are aligned with (or located in) prescribed positions of the land portion 25 will be described.

First, by using an automatic machine provided with, e.g., a CCD (charge coupled device) camera (not shown), the alignment marks 11a and 11b of the PCB substrate 1 are optically recognized, whereby a position of the PCB substrate 1 is identified and then is adjusted so as to be commensurate with a prescribed position. Then, the alignment marks 26a and 26b of the display panel 21 are optically recognized in a similar manner, whereby a position of the display panel 21 is identified and then is adjusted so as to coincide with a prescribed position.

Thereafter, the PCB substrate 1 is moved so that the alignment marks 11a, 11b, 26a and 26b satisfy a prescribed positional relationship, i.e., the respective input terminals 23a, 23b and 23c of the TCPs 24a, 24b and 24c mounted on the display panel 21 are positioned or located in respective prescribed positions of the land portion 25 of the PCB substrate 1. In this state, the PCB substrate 1 and the TCPs 24a, 24b and 24c are heat-bonded under pressures from the TCP side to electrically connect the PCB substrate 1 with the TCPs 24a, 24b and 24c, thus preparing a liquid crystal panel unit.

In this embodiment (FIG. 5), the alignment marks 11a, 11b, 26a and 26b are used at the time of positional alignment of the display panel 21 mounted thereon the TCPs 24a, 24b and 24c and the PCB substrate 1 for inputting electric signals to the TCPs 24a, 24b and 24c, thus allowing positioning of the PCB substrate 1 by the automatic machine with exact accuracy.

Particularly, in a mounting (or connecting) step with respect to the liquid crystal display panel, the display panel has an electrode wiring structure with a very fine (small) pitch, so that the alignment marks used in the present invention are very effective in connecting (or mounting), e.g., the PCB substrate to the display panel with minute accuracy. Further, the PCB substrate (electric circuit substrate) according to the present invention may particularly suitably be used in combination with a high-definition display panel using a ferroelectric liquid crystal or a TFT (thin film transistor).

Incidentally, in the above-described embodiment of FIG. 5, the PCB substrate has a multi-layer structure consisting of four wiring layers (and three insulating layers) but may have a multi-layer structure consisting of at least five wiring layers (and at least four insulating layers) so long as the entire solid (black) portion as a background of the alignment mark is positioned under the alignment mark portion provided to the first outer (outermost) wiring layer via at least one inner wiring layer (and at least two insulating layers) as described in the above embodiment (FIG. 5).

Further, in the above embodiments shown in FIGS. 3–5, each of the alignment marks has a cross shape but may have any shape if the alignment mark is readily recognized.

As described hereinabove, according to the present invention, it is possible to surely perform positioning (positional alignment) with accuracy while preventing recognition error or recognition failure by the automatic machine because the alignment mark of the outermost wiring layer of the PCB substrate having a multi-layer structure is not superposed on the conductor (wiring) pattern of the lower (inner) wiring layer(s) located under the alignment mark as observed in an ordinary alignment mark structure and can be optically recognized with a good contrast based on a combination of the blank portion and the entire solid portion as a background of the alignment mark when viewed from thereover.

What is claimed:

1. An electric circuit substrate having a multilayer structure, comprising: at least three wiring layers including an outermost wiring layer, at least one first inner wiring layer disposed under said outermost wiring layer, and a second inner wiring layer disposed under said at least one first inner wiring layer, each provided with a prescribed conductor pattern, respectively, wherein said outermost wiring layer has an alignment mark, said at least one first inner wiring layer has a blank portion free from its conductor pattern in a position immediately under the alignment mark, and said second inner wiring layer has an entire solid portion of its conductor pattern in a position immediately under the blank portion.

2. A substrate according to claim 1, wherein said alignment mark comprises a conductor identical to that of the conductor pattern formed on said outermost wiring layer.

3. A substrate according to claim 2, wherein said alignment mark comprises copper foil.

4. A substrate according to claim 1, wherein said alignment mark is coated with a coating material.

5. A substrate according to claim 4, wherein said alignment mark is coated with plated solder.

6. A substrate according to claim 1, wherein the entire solid portion corresponds to the blank portion and comprises a conductor foil treated so as to have a black surface.

7. A substrate according to claim 6, wherein the conductor foil is copper foil.

8. A substrate according to claim 7, which further comprises at least two insulating layers each disposed between the consecutive two wiring layers, respectively.

9. A substrate according to claim 8, wherein each of said at least two insulating layers comprises a glass fiber-containing epoxy resin.

10. A substrate according to claim 1, wherein said at least one first inner wiring layer comprises one inner wiring layer and said substrate further comprises at least two insulating layers including an insulating layer disposed between said outermost wiring layer and said one inner wiring layer and an insulating layer disposed between said one inner wiring layer and said second inner wiring layer.

11. A substrate according to claim 1, wherein said alignment mark is in the form of a cross.

12. A substrate according to claim 1, which comprises four wiring layers.

13. A liquid crystal panel unit, comprising:

a liquid crystal device including a pair of substrates and a liquid crystal disposed between the substrates, and having an alignment mark, a tape carrier package having thereon a semiconductor element for driving the liquid crystal device and mounted on the liquid crystal device, and an electric circuit substrate connected with the tape carrier package and having a multilayer structure, comprising: at least three wiring layers including an outermost wiring layer, at least one first inner wiring layer disposed under said outermost wiring layer, and a second inner wiring layer disposed under said at least one first inner wiring layer, each provided with a prescribed conductor pattern, respectively, wherein said outermost wiring layer has an alignment mark, said at least one first inner wiring layer has a blank portion free from its conductor pattern in a position immediately under the alignment mark of said outermost wiring layer, and said second inner wiring layer has an entire solid portion of its conductor pattern in a position immediately under the blank portion.

* * * * *

UNITED STATES PATENT AND TRADEMARK OFFICE
CERTIFICATE OF CORRECTION

PATENT NO.    : 5,768,107

DATED         : June 16, 1998

INVENTOR(S)   : TOSHIMICHI OUCHI ET AL.

Figure 1:
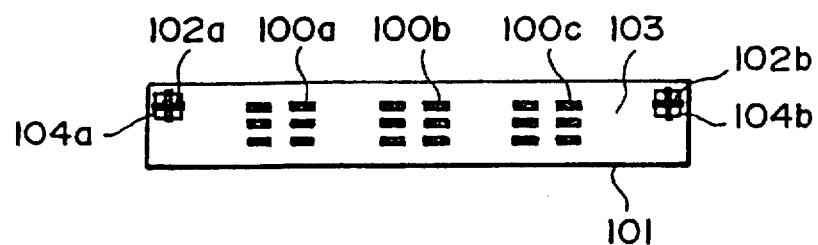
FIG. 1 is a plan view of an ordinary electric circuit substrate having an alignment mark structure.
Figure 2:
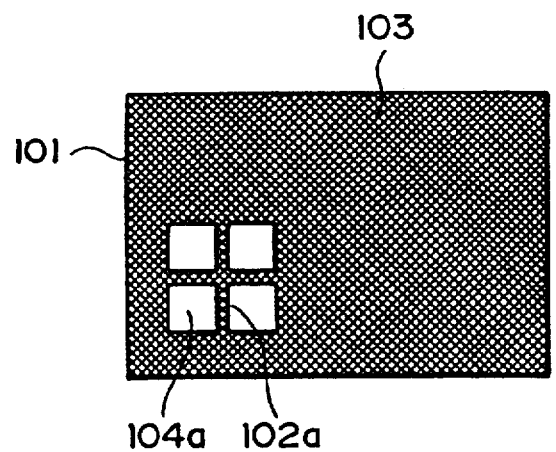
FIG. 2 is a partially enlarged view of a portion including the alignment mark structure shown in FIG. 1.

It is certified that error appears in the above-identified patent and that said Letters Patent is hereby corrected as shown below:

<u>IN THE DRAWINGS</u>:

Sheet 1 of 3, FIGS. 1 and 2,

FIGS. 1 and 2, should be designated by a legend "PRIOR ART" as shown on the attached sheet.

<u>COLUMN 3</u>:

Line 5, "include" should read --includes--.

Signed and Sealed this

Seventeenth Day of April, 2001

*Attest:*

NICHOLAS P. GODICI

*Attesting Officer*      *Acting Director of the United States Patent and Trademark Office*